United States Patent [19]
Liu et al.

[11] Patent Number: 5,625,220
[45] Date of Patent: Apr. 29, 1997

[54] SUBLITHOGRAPHIC ANTIFUSE

[75] Inventors: David K.-Y. Liu, Cupertino, Calif.; Kueing-Long Chen, Plano; Bert R. Riemenschneider, Murphy, both of Tex.

[73] Assignee: Texas Instruments Incorporated, Dallas, Tex.

[21] Appl. No.: 287,323

[22] Filed: Aug. 8, 1994

Related U.S. Application Data

[63] Continuation-in-part of Ser. No. 233,483, Apr. 26, 1994, abandoned, which is a continuation of Ser. No. 41,304, Mar. 31, 1993, abandoned, which is a division of Ser. No. 860,473, Mar. 30, 1992, Pat. No. 5,219,782, and a continuation-in-part of Ser. No. 113,507, Aug. 27, 1993, Pat. No. 5,365,105, which is a continuation of Ser. No. 954,593, Sep. 30, 1992, abandoned, which is a continuation of Ser. No. 657,703, Feb. 19, 1991, abandoned, and a continuation-in-part of Ser. No. 20,272, Feb. 18, 1993, abandoned, which is a continuation of Ser. No. 657,597, Feb. 19, 1991, abandoned.

[51] Int. Cl.[6] ................................................ H01L 29/00
[52] U.S. Cl. .................................... 257/530; 257/755
[58] Field of Search ................................. 257/530, 755

[56] References Cited

U.S. PATENT DOCUMENTS

| | | | |
|---|---|---|---|
| 4,569,120 | 2/1986 | Stacy et al. | 29/574 |
| 4,812,419 | 3/1989 | Lee et al. | 437/203 |
| 4,823,181 | 4/1989 | Moshen et al. | 357/51 |
| 4,847,732 | 7/1989 | Stopper et al. | 361/395 |
| 4,899,205 | 2/1990 | Hamdy et al. | 357/51 |
| 4,914,055 | 4/1990 | Gordon et al. | 437/192 |
| 4,943,538 | 7/1990 | Moshen et al. | 437/52 |
| 5,019,532 | 5/1991 | Kaya | 437/186 |
| 5,057,451 | 10/1991 | McCollum | 437/69 |
| 5,087,958 | 2/1992 | Chen et al. | 357/51 |
| 5,095,362 | 3/1992 | Roesner | 257/530 |
| 5,110,754 | 5/1992 | Lowrey et al. | 437/52 |
| 5,126,290 | 6/1992 | Lowrey et al. | 437/235 |
| 5,166,556 | 11/1992 | Hsu et al. | 307/465 |
| 5,246,873 | 9/1993 | Matsuo et al. | 437/52 |
| 5,508,220 | 4/1996 | Eltoukhy et al. | 257/530 |

FOREIGN PATENT DOCUMENTS

| | | |
|---|---|---|
| 0224418 | 3/1987 | European Pat. Off. ......... 257/530 |
| 250078 | 5/1987 | European Pat. Off. . |
| 58-77097 | 5/1983 | Japan . |
| 59-148198 | 8/1984 | Japan . |
| 2146745 | 6/1990 | Japan . |
| 1494040 | 7/1987 | U.S.S.R. . |

OTHER PUBLICATIONS

Thomas Clifton Penn, "New Methods of Processing Silicon Slices", *Science* vol. 208 (May 1980) pp. 923–926.

Liu et al., "Scaled Dielectric Antifuse Structure for Field Programmable Gate Array Applications", Aug. 23, 1990.

Yau, Leo D., *Determination of the Fowler–Nordheim Tunneling Barrier from Nitride to Oxide in Oxide: Nitride Dual Dielectric*, IEEE Electron Device Letters, vol. EDL—7, 6 Jun. 1986, pp. 365–367.

*Primary Examiner*—J. Carroll
*Attorney, Agent, or Firm*—Mark A. Valetti; W. James Brady, III; Richard L. Donaldson

[57] ABSTRACT

This antifuse includes: a sublithographic conductive pattern (18); an antifuse material (24) overlying said sublithographic conductive pattern (18); and a conductive layer (26) overlying the antifuse material (24) to form a reduced area antifuse (10). Other devices, systems and methods are also disclosed.

10 Claims, 2 Drawing Sheets

SUBLITHOGRAPHIC ANTIFUSE

This application is a continuation-in-part of the following applications:

Ser. No. 08/233,483, filed Apr. 26, 1994, abandoned, which is a continuation of Ser. No. 08/041,304, filed Mar. 31, 1993, abandoned, which is a divisional of Ser. No. 07/860,473, filed Mar. 30, 1992, now U.S. Pat. No. 5,219,782; and a continuation-in-part of Ser. No. 08/113,507, filed Aug. 27, 1993, U.S. Pat. No. 5,365,105, which is a continuation of Ser. No. 07/954,593, filed Sep. 30, 1992 now abandoned, which is a continuation of Ser. No. 07/657,703, filed Feb. 19, 1991 now abandoned; and a continuation-in-part of Ser. No. 08/020,272, filed Feb. 18, 1993, abandoned, which is a continuation of Ser. No. 07/657,597, filed Feb. 19, 1991 now abandoned.

CROSS-REFERENCE TO RELATED PATENTS

The following commonly assigned patents are hereby incorporated herein by reference:

| Pat No. | EFD | TI Case No. |
| --- | --- | --- |
| 5,219,782 | 3/30/92 | TI-15178 |
| 08/233,483 | 03/30/92 | TI-15178.1A |
| 08/113,507 | 2/19/91 | TI-15276B |
| 08/020,272 | 02/19/91 | TI-14977A |

FIELD OF THE INVENTION

This invention generally relates to devices and methods for manufacturing sublithographic semiconductor features and more particularly to devices and methods for manufacturing a sublithographic antifuses.

BACKGROUND OF THE INVENTION

In many types of circuits, it is desirable to be able to control feature size to increasingly smaller dimensions. Examples of these situations would be an element where a small interface area is desired to minimize parasitic capacitance. As examples: in a pn junction diode it may be desirable to decrease the junction area to reduce parasitic capacitance; in a polysilicon to polysilicon interconnect within an integrated circuit it may be desirable to minimize contact area to reduce parasitic capacitance; and, in an antifuse device it may be desirable to minimize antifuse contact area, again to reduce parasitic capacitance. Without limiting the scope of the invention, its background is described in connection with antifuses.

In integrated circuit fabrication, it is often desirable to allow a system whereby a user may customize an integrated circuit to their particular needs. Because of the great expense involved in designing specific integrated circuits for many specific tasks, programmable integrated circuits have been developed which allow the user to program the integrated circuit to their specific needs. An emerging type of programmable device is field programmable gate arrays (FPGAs). These devices provide large arrays of fusible type structures which allow the user to program the functional operation of the devices by altering the conductive state of these fusible devices. One such fusible device is called an antifuse. An antifuse operates in the opposite of the traditional meaning of the term "fuse". An antifuse is programmed by providing a voltage above a threshold determined by the characteristics of the device which causes a large current to pass through a dielectric layer between two conductive layers. After this threshold voltage has been reached, a conductive connection between the two conductive layers is permanently established. This is opposite the traditional meaning of a fuse in that when a high current is passed through a traditional fuse, the fuse is burned open and thus a conductive connection is broken.

As in all integrated circuits, it is desirable to provide a circuit which operates as rapidly as possible. Prior art antifuse structures provide horizontal areas which are limited by the lithography capabilities used to fabricate the integrated circuit. These devices are in arrays with a very thin dielectric. Because these dielectrics must be very thin to keep the programming voltage reasonably low, a very high capacitance is provided between the conductive leads forming the gate array. In addition, because there are many of these devices along a particular lead, the resistive/capacitive (RC) time constant for a particular lead is very high. This creates a time lag from when a voltage is applied to a certain lead until the lead is charged up to the desired voltage. Thus in order to minimize this time lag it is desirable to minimize the capacitive coupling provided by an antifuse element.

Heretofore, in this field, FPGA devices have featured one-time fusible links as programmable low impedance interconnects. Prior art fusible links utilize an antifuse structure consisting of an oxide-nitride-oxide or O/N/O three layer dielectric interposed between N+ diffusion and N+ polysilicon layers. The antifuse is programmed by applying a voltage above a threshold voltage determined by the physical characteristics of the dielectric, the voltage causing a large current to flow and form a permanent connection between the two conductive layers. The prior art antifuse requires programming voltages around 16.5 V applied to the antifuse to achieve this low impedance interconnection. The antifuse circuits so programmed exhibit a resistance centering around 500 ohms. The prior art antifuse is described in Mohsen, et al., "Programmable Low Impedance Antifuse Element", U.S. Pat. No. 4,823,181 issued Apr. 18, 1989. This patent is hereby incorporated by reference. A field-programmable gate array structure which utilizes anti-fuse elements is described in Gamal et al., "An Architecture For Electrically Configurable Gate Arrays" IEEE Journal of Solid State Circuits, Vol. 24, No. 2, pp. 394–398, (April 1989). This article is hereby incorporated by reference.

SUMMARY OF THE INVENTION

In prior art devices, the disadvantage of high capacitance was traded against programming voltage by using an antifuse layer of increased thickness. With increased antifuse thickness, increased programming voltage is required to activate the antifuse. As device geometries are decreased, these devices are less able to tolerate the high programming voltages. These programming voltages, as a undesired side effect, are applied across dielectric layers (i.e. gate oxide, field oxide) for which antifusing is not desired. Therefore increased antifuse thickness presents a barrier to reduced device geometries in the prior art.

What then is needed is a device which reduces the difficulties of capacitive loading without corresponding increases in programming voltage. Described embodiments of the present invention in large measure overcome these difficulties by decreasing the area of the antifuse by using smaller features than those possible in prior art devices. In this manner capacitance of an unprogrammed antifuse may be decreased without increasing the programming voltage.

In one described embodiment of the present invention, a method for manufacturing a sublithographic semiconductor feature is disclosed. This method comprises: depositing a feature material on a substrate: depositing and patterning a resist material over said feature material; vertically, anisotropically etching said feature material to form a feature pattern with substantially vertical sidewalls underlying said resist material pattern; isotropically etching said feature pattern such that said feature pattern sidewalls are undercut from beneath said resist material pattern to form a reduced geometry feature or sublithographic feature whereby said reduced geometry feature has a geometry less than that of the overlying resist material pattern.

In another described embodiment of the present invention, the method described above is applied to the manufacturing of an antifuse. In this antifuse one electrode of the antifuse is the above described reduced geometry semiconductor feature formed from the feature material as described above. This antifuse is formed by depositing an antifuse layer over the reduced geometry feature and depositing a second electrode over the antifuse layer. In this manner the antifuse area is reduced over that possible using standard lithographic process to form a sublithographic feature and capacitance is reduced correspondingly.

Another described embodiment comprises an antifuse wherein the antifuse dielectric is a nitride-oxide (N-O)layer. The further advantage gained using this structure is that the programming voltage required is substantially reduced due to the asymmetric current conduction characteristics of the N-O dielectric. This lower programming voltage enhances the scalability of this structure to smaller processes as the need for high voltage transistors is reduced. One advantage of this structure is an effective reduction in dielectric thickness, reducing the capacitance of the antifuse associated with the thickness of the dielectric. The junction capacitance formed due to the diffusion layer used as a bottom electrode in the prior art is eliminated by using a polysilicon layer as the bottom electrode, enhancing the speed of the antifuse circuit of the invention over the speed of the prior art antifuse structure.

Another embodiment of the present invention includes an array of antifuses arranged in rows and columns for use in programmable logic integrated circuit devices such as a field-programmable gate array (FPGA), comprising: a plurality of conductive features, each formed as the reduced geometry feature described above; an insulating layer formed on a plurality of feature sidewalls of said first plurality of conductive features; a dielectric layer formed over said plurality of feature sidewalls and said plurality of conductive features; and a second plurality of conductive features running perpendicular to said first plurality of conductive features, said second plurality of conductive features extending onto said dielectric layer over said first plurality of conductive features such that an antifuse via is formed. In another embodiment of the present invention, said first and/or second plurality of conductive features comprise polycrystalline silicon and a conductive material selected from the group of titanium, tungsten, molybdenum, platinum, titanium silicide, tungsten silicide, molybdenum silicide, platinum silicide, titanium nitride and combinations thereof. In another alternative embodiment, the first and second plurality of conductive features might be amorphous silicon.

Further enhancements disclosed herein involve using polysilicided conductor leads to couple the antifuse to other parts of the array or circuit. This technique effectively reduces the sheet resistance of the interconnections to the antifuse and further enhances the speed of the antifuse circuit.

BRIEF DESCRIPTION OF THE DRAWINGS

Corresponding numerals and symbols in the different figures refer to corresponding parts unless otherwise indicated.

DETAILED DESCRIPTION OF PREFERRED EMBODIMENTS

Figure 1:
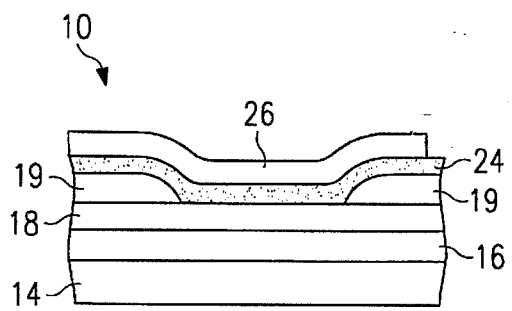
FIG. 1, in partial cross section, illustrates a microelectronic device formed in accordance with the prior art.

As shown in Prior Art FIG. 1, a substrate 14 is initially provided. A first oxide layer 16 overlies the substrate 14. A first polysilicon layer 18 overlies the first oxide layer 16. A second oxide layer 19 overlies the first polysilicon layer 18 and is patterned such that an area of the polysilicon remains exposed. Antifuse dielectric material 24 overlies the exposed first polysilicon layer 18 and a second polysilicon layer 26 is formed over the antifuse material 24 and the second oxide layer 19. Typical thickness of the first and second polysilicon layers is between 2000 and 4000 Å. The capacitance between first conductor 18 and second conductor 26 of an unprogrammed device is determined by the thickness of antifuse material 24 and interfacial surface area between antifuse material 24 and second conductor 26. Reductions in prior art capacitance have been limited to: using minimum geometry lithography to form the conductive patterns; and, increasing thickness of antifuse material 24. These two methods have conflicting requirements. Increasing thickness of antifuse dielectric 24 also increases programming voltages. However, increased programming voltages present a barrier to decreasing geometries because the higher voltages are more likely to breakdown dielectric material in unintended areas.

Figure 1A:
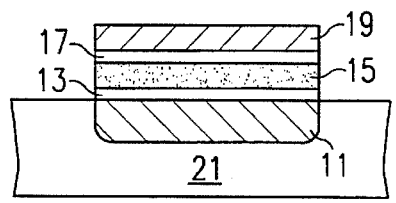
FIG. 1a, in partial cross section, illustrates another microelectronic device formed in accordance with the prior art in which an O/N/O dielectric antifuse is used.

In FIG. 1a, a diagram of an antifuse with an O/N/O dielectric as known in the prior art is shown. In substrate 21, bottom electrode 11 is diffused. The substrate and the bottom electrode are of opposite conductivity types, for the example illustrated the substrate is a P type and the bottom electrode is a heavily doped diffusion area of the N type. N+ diffusion layer 11 is covered with a thermally grown layer of silicon dioxide 13, over which is deposited a thin layer of silicon nitride 15. A second oxide layer is deposited over the nitride by means of steam oxidation techniques. Finally the top conductor layer 19 of N type polysilicon is deposited.

Figure 2A:
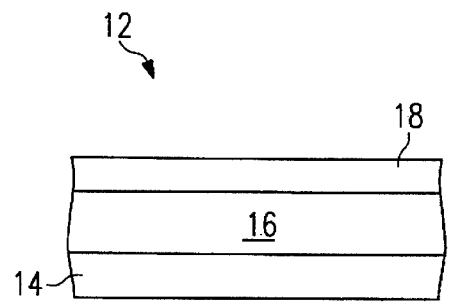
FIGS. 2a–2f, in partial cross section, illustrates a microelectronic device formed in accordance with a preferred embodiment of the present invention, used to fabricate other embodiments of the present invention.
Figure 2B:
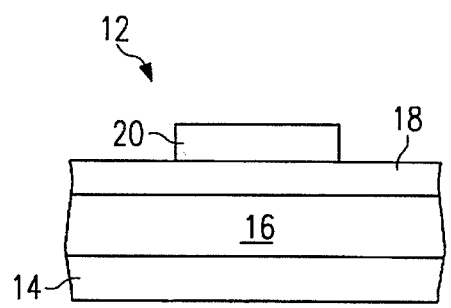
Figure 2C:
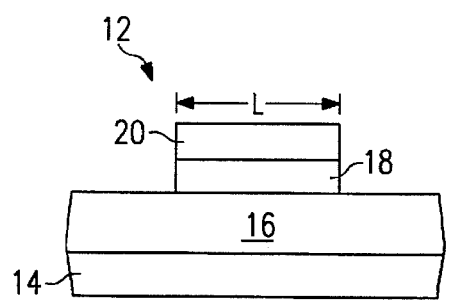
Figure 2D:
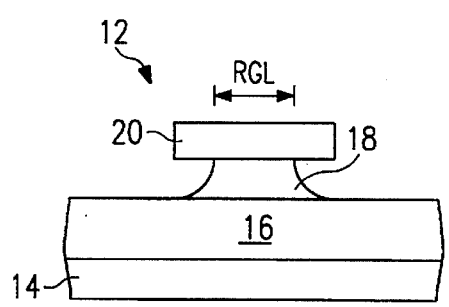
Figure 2E:
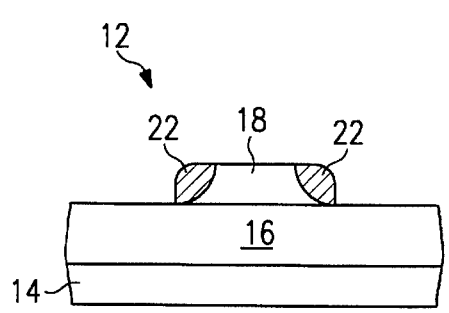
Figure 2F:
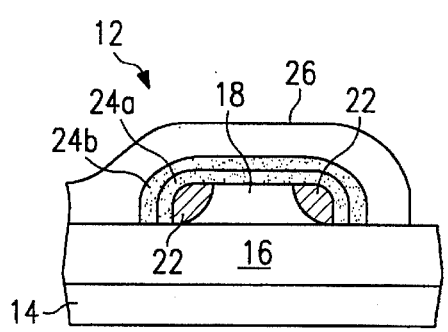

A preferred embodiment of the present invention is illustrated, in partial cross section, in FIG. 2f. A first oxide layer 16 overlies the substrate 14. A reduced geometry feature or reduced geometry first conductor 18 overlies oxide 16. The reduced geometry first conductor 18 has a sidewall insulator 32 about its perimeter. An antifuse layer 24a–b overlies the reduced geometry conductor 18 and its associated sidewall insulator 22. A second conductor 26 overlies the antifuse material 24 such that an antifuse is formed between the top of the reduced geometry first conductor 18 and the second conductor 26.

FIG. 2a, in partial cross section, illustrates a microelectronic device 12 formed in accordance with a preferred embodiment of the present invention after a first processing stage. As shown in FIG. 2a, a substrate 14 is initially provided. Substrate 14 may be any of a number of materials but in this preferred embodiment comprises crystalline silicon, thus allowing the fabrication of other devices such as transistors and diodes. Substrate 14 may also, for example, be an insulator. Silicon dioxide layer 16 is formed on the surface of substrate 14 using thermal oxidation to a thickness of approximately 5000 Å. Feature material or polycrystalline silicon layer 18 is formed on the surface of silicon dioxide layer 16 using chemical vapor deposition. Polycrystalline silicon layer 18 has a thickness of between 2000 and 4000 Å in this preferred embodiment. To provide additional conductivity and thus reduce the resistance of polycrystalline silicon layer 18, additional materials such as titanium, tungsten, molybdenum, platinum, titanium silicide, tungsten silicide, molybdenum silicide, platinum silicide or titanium nitride may be incorporated into polycrystalline silicon layer 18 as additional layers or incorporated into the material itself. In addition, combinations of these materials or other highly conductive materials may be incorporated into polycrystalline silicon layer 18. The use of polycrystalline silicon in layer 18 is exemplary and many other materials will become apparent to those skilled in the art in light of this specification and are considered within the scope of the present invention. The preferred embodiment structure shows the feature material or polycrystalline silicon layer 18 being deposited over the oxide layer 16 to provide isolation from underlying devices.

Referring now to FIG. 2b, a photoresist 20 has been formed and patterned using lithographic techniques well known in the art.

Referring now to FIG. 2c, polycrystalline layer 18 is patterned to form the bottom conductor of the antifuse. This patterning is performed using common photolithographic techniques, typically followed by an anisotropic dry etch to remove undefined polysilicon. In an illustrative embodiment, this patterned polysilicon layer 18 has a linewidth, L=0.8 μm, as shown in FIG. 2c.

Referring now to FIG. 2d, the photoresist 20 is kept in place for a subsequent isotropic etch of the polysilicon layer 18. This second etch is monitored to stop when the desirable profile has been achieved. By this process a reduced geometry feature or reduced geometry patterned polysilicon layer 18 has been effected. In an illustrative embodiment, a 0.2 μm undercut has been achieved from each side of the polysilicon, leaving a reduced geometry linewidth, RGL= 0.4 μm at the top of the reduced geometry polysilicon layer 18. If the polysilicon layer 18 is square shaped, with equal depth into the page as reduced geometry linewidth shown, and if a similar etch profile has been achieved in this dimension, then a 75% reduction in the area of the top surface of the polysilicon 18 will have been achieved, corresponding to an unprogrammed antifuse capacitance of ¼ the original unprogrammed antifuse capacitance.

With reference now to FIG. 2e, a partial cross section of the microelectronic device 12, preferably an antifuse 12, is shown after removal of the photoresist 20, deposition of a conformal insulator layer and a subsequent vertical anisotropic etch. Due to greater vertical depth of a conformal insulator layer over edges of the polysilicon layer 18 topography, a sidewall insulator 22 remains on the sides of the polysilicon layer 18 after the anisotropic etch. As an alternative process, if the roughness of the final polysilicon layer 18 is a concern, a thin nitride layer may be deposited prior to the insulator deposition and etch. Sidewall insulator 22 serves to further reduce the capacitance of an unprogrammed antifuse by reducing the exposed area of polysilicon layer 18. As an alternative embodiment, the step of depositing sidewall insulator 22 may be eliminated altogether.

Now referring to FIG. 2f, an antifuse layer 24a–b, and another polysilicon layer 26 is deposited. Antifuse layer 24a–b is preferably deposited in two parts, 24a and 24b. As will be described hereinbelow, layer 24a will first be formed over the polycrystalline silicon layer 18 and the sidewall insulator 22, and then layer 24b will be formed over layer 24a. The materials for these layers will preferably be chosen such that the voltage required to achieve dielectric breakdown of the antifuse will be asymmetric; the voltage required to break down the antifuse layer 24a–b will vary depending on the polarity of the applied voltage. Polycrystalline silicon layer 26 has a thickness of between 2000 and 4000 Å in this preferred embodiment. To provide additional conductivity and thus reduce the resistance of polycrystalline silicon layer 26, additional materials such as titanium, tungsten, molybdenum, platinum, titanium silicide, tungsten silicide, molybdenum silicide, platinum silicide or titanium nitride may be incorporated into polycrystalline silicon layer 26 as additional layers or incorporated into the material itself. In addition, combinations of these materials or other highly conductive materials may be incorporated into polycrystalline silicon layer 26. The use of polycrystalline silicon in layer 26 is exemplary and many other materials will become apparent to those skilled in the art in light of this specification and are considered within the scope of the present invention. The actual antifuse area is the antifuse material interposed between the reduced top surface of the remaining polysilicon layer 18 and the bottom surface of the polysilicon layer 26.

Referring to the processes described in FIGS. 2a–2f, silicon dioxide layer 16 may be formed by chemical vapor deposition or thermal oxidation of substrate crystalline silicon layer 14. If thermal oxidation is used, then an additional thickness of substrate 14 must be provided to allow for consumption of this additional area by the thermal oxidation process. In the present embodiment, silicon dioxide layer 16 comprises approximately 2000 Å of silicon dioxide. In additional embodiments, silicon dioxide layer 16 may be other insulators or compound insulators to provide the function of silicon dioxide layer 16. The thickness of silicon dioxide layer 16 is provided to minimize the capacitive coupling between conductive layers to be formed on the surface of silicon dioxide layer 16 and underlying substrate crystalline silicon layer 14. Preferably, the vertical anisotropic etch processes described are accomplished using a plasma of hydrofluoric acid to etch sidewall insulators 22 (typically $SiO_2$) and a plasma of carbon tetrachloride to etch polycrystalline silicon layer 18. This carbon tetrachloride etch is carefully controlled by controlling the flow rates, temperature and plasma energy to provide a high rate of selectivity of polycrystalline silicon over silicon dioxide. The precise settings of the etching process are highly dependent upon the equipment used. This selectivity allows the etch to stop when the etch passes through polycrystalline silicon layer 18 to silicon dioxide layer 16. Although it is preferable to use a highly selective etch, this step is not critical in that silicon dioxide layer 16 is very thick and allows for some etching of silicon dioxide layer 16.

Still referring to the processes described in FIGS. 2a–2f, the antifuse layer 24a–b is preferably silicon dioxide. As an alternative embodiment, an antifuse with asymmetric and lower voltage programming characteristics can be utilized. This asymmetric antifuse is formed by depositing a layer of silicon nitride on the surface of the structure of FIG. 2e. This is accomplished using chemical vapor deposition in an atmosphere such as silane and ammonia. The silicon nitride layer is then subjected to thermal oxidation in a steam ambient to provide an oxynitride layer on the surface of the silicon nitride layer. The use of the nitride-oxynitride (N-O) dielectric 24a–b provides a two-way characteristic for the breakdown of the antifuse 24a–b. Alternatively, the N-O dielectric 24a–b may be comprised of a silicon nitride and silicon dioxide (or another oxide)layer.

As presented in the particular example herein described, substrate 14 is comprised of crystalline silicon thus allowing the fabrication of other devices such as transistors, diodes and logic structures such as AND gates, OR gates, NAND gates and the like. Substrate 14 may be comprised of polycrystalline silicon or any other conductive material. To provide additional conductivity and thus reduce the resistance of the polycrystalline silicon layer 18, additional materials such as, but not limited to, titanium, tungsten, molybdenum, platinum, titanium silicide, tungsten silicide, molybdenum silicide, platinum silicide or titanium silicide may be incorporated into the polycrystalline silicon layer as additional layers or incorporated into the material itself. The use of polycrystalline silicon is exemplary and advantageous use of many other materials will become apparent to those skilled in the art in light of this specification and are considered within the scope of the present invention. In this embodiment, polycrystalline silicon layer 18 is deposited to a thickness of 2000–5000 Å. The choice of thickness is limited at the low end by the resistivity desired for the conductors, and at the high end by the limitations of the lithography.

A layer of silicon nitride is then deposited as the first step in forming the N/O dielectric layer 24a–b. Chemical vapor deposition on the patterned silicon dioxide layer 16 is used, and the silicon nitride is in contact with the polycrystalline layer 18 in area that is less than a minimum feature size. The chemical vapor deposition is preferably performed in a chamber having an atmosphere such as silane and ammonia. The silicon nitride layer may then be subjected to thermal oxidation in a steam ambient to provide an oxynitride layer on the surface of the silicon nitride layer. Alternatively, a layer of silicon dioxide may be deposited using chemical vapor deposition. The thin dielectric thus formed has a thickness of approximately 65–80 Å. FIG. 2d depicts the completed antifuse structure of the invention. Second conductive layer 26 is deposited to a thickness in the range of 2000–5000 Å. As detailed above in the description of layer 18, the second conductive layer 26 may be comprised of a variety of materials to provide enhanced conductivity.

Figure 3:
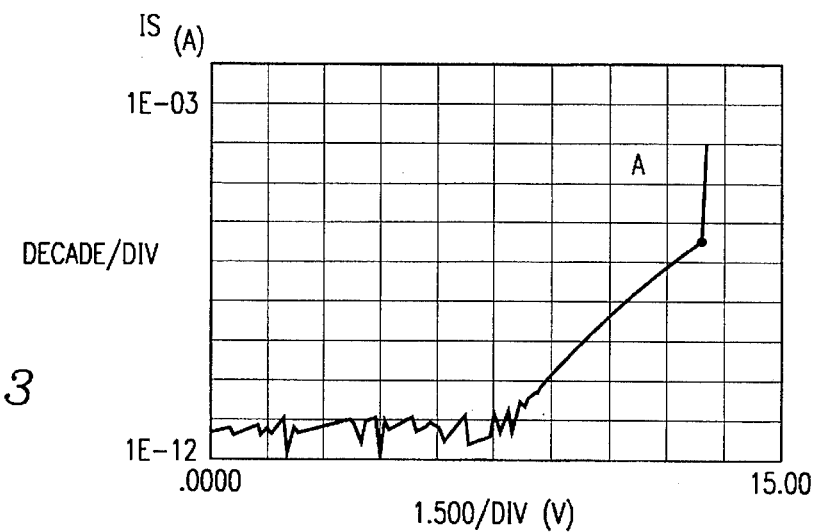
FIGS. 3–4 are plots of the current vs. voltage characteristics of the N-O dielectric antifuse.
Figure 4:
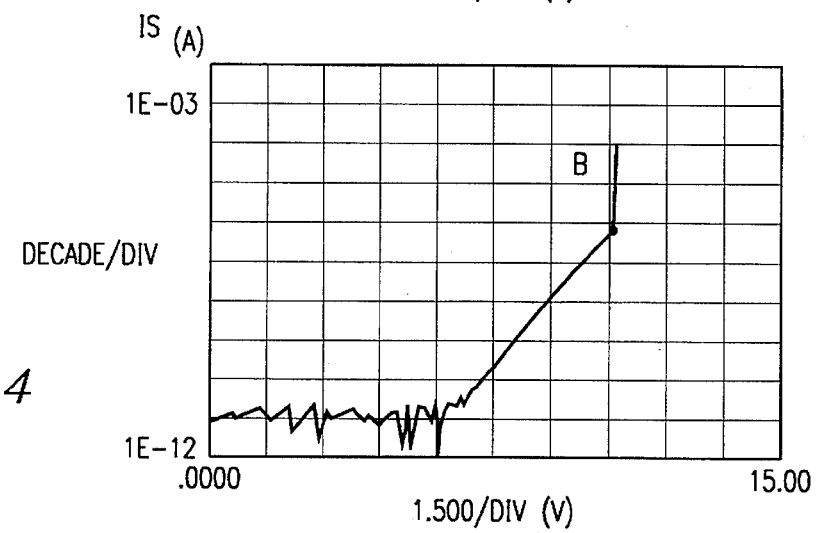

FIGS. 3–4 depicts the current vs. voltage characteristic for the process of programming the N-O dielectric antifuse described above. It is important to note that the current vs. voltage (IV) characteristic is only for the programming step. Once the device has been programmed, it retains new characteristics corresponding to a highly conductive state. FIG. 3 shows the IV characteristic for the positive direction. In this instance, a potential is applied to second conductive layer 26 relative to first conductive layer 18 and antifuse layer 24a–b provides a breakdown voltage of approximately 13½ volts. FIG. 4 shows the IV characteristic for the negative direction. In this instance, a positive potential is applied to polycrystalline silicon layer 18 relative to the second conductive layer 26 and the breakdown voltage is approximately 10½ volts. This breakdown voltage is less than in prior art antifuses, and has been accomplished without decrease in device speed or manufacturing efficiency.

The asymmetric breakdown voltage characteristic may be understood as described in Liu, et al. "Scaled Dielectric Antifuse Structure for Field Programmable Gate Array Applications", IEEE Electron Device Letters, Vol. 12, No. 4 (April 1991). When a positive bias is applied to the second conductive layer 26, electrons are injected from the first conductive layer 16 into the silicon nitride which forms the bottom component 24a of the dielectric layer 24. The electrons are transported through the nitride via nitride traps, to be injected across the "thin oxide" into the second conductive layer 26. The availability of carriers for the Fowler-Nordheim tunneling is determined by the density of the traps in the nitride layer of the dielectric layer 24. In contrast, when a potential is applied to the antifuse in the opposite direction, the electrons first tunnel across the thin oxide of the top component 24b of the dielectric and then transport through the silicon nitride by means of the traps in the nitride into the first conductive layer 16. The source of available carriers is now the preferred embodiment polysilicon, which has a much higher density of carriers than the nitride. Thus, the current flowing between the top and bottom conductive layers 16,26 is much higher when the first layer 16 has a positive potential relative to the top layer 26.

In accordance with the embodiment of the invention in which the dielectric layer 24a–b is an asymmetric antifuse layer, when the antifuse 12 is subjected to a voltage across the first and second conductors 16,26 greater than a characteristic threshold voltage, a conductive filament forms through the dielectric layer 24a–b and permanently couples the first and second conductors 16,26. The antifuse 12 is further operable such that a different characteristic threshold voltage occurs when a voltage of opposite polarity is applied to the first and second conductor layers 16,26.

Figure 5:
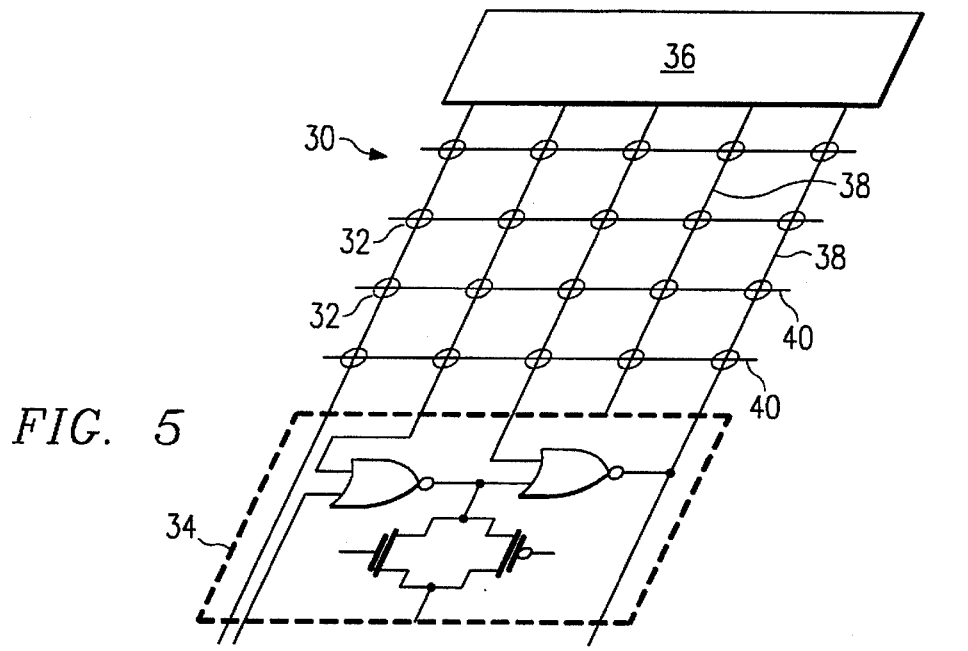
FIG. 5 is a block diagram of a Field Programmable Gate Array device embodying the anti-fuse of the invention herein disclosed.

FIG. 5 depicts a Field Programmable Gate Array (FPGA) device employing the preferred embodiment antifuses. An array of antifuse circuits 30 is constructed, each antifuse being formed as described above. A plurality of bottom layer conductors 38 is formed in parallel rows, an antifuse dielectric 40 is formed upon each at an intersection point in the array, and a plurality of top layer conductors 32 is formed in parallel to one another and perpendicular to the bottom layer conductors 38 such than an antifuse is formed at each of the intersections in the array. A plurality of associated universal logic modules is formed (36,34) such that the inputs and outputs are tied to either bottom or top level conductors feeding the antifuse array. The user can then selectively interconnect the logic gates in the universal logic modules by programming selected ones of the antifuse circuits in the array, and thereby form various functions as required by the user's application.

A few preferred embodiments have been described in detail hereinabove. It is to be understood that the scope of the invention also comprehends embodiments different from those described, yet within the scope of the claims. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, although the illustrative embodiments were described as antifuse devices, a reduced feature size capacitor could be formed using essentially the same process, but thickening the dielectric so it did not have antifusing characteristics. A reduced feature area diode could be formed by forming a doped reduced area polysilicon feature by the process described above and by forming an oppositely doped polysilicon layer over the reduced area polysilicon feature—eliminating the step of forming a dielectric layer between the two polysilicon conductive layers. It is therefore intended that the appended claims encompass any such modifications or embodiments.

What is claimed is:

1. A sublithographic semiconductor antifuse, said antifuse comprising:

a substrate;

a horizontally sublithographic conductive pattern overlying and distinct from said substrate, the entire breadth of at least one dimension of said sublithographic conductive pattern being less than a minimum lithographic feature size and wherein said horizontally sublithographic conductive pattern includes substantially vertical sidewalls;

an antifuse material overlying said horizontally sublithographic conductive pattern;

a conductive layer over said antifuse material whereby an antifusing area is formed between said horizontally sublithographic conductive pattern and said conductive layer; and a sidewall insulator material on at least one of said sidewalls of said horizontally sublithographic conductive pattern and underlying said antifuse material.

2. The antifuse of claim 1 wherein said antifuse material is an oxide.

3. The antifuse of claim 1 wherein said antifuse material is comprised of a first dielectric layer overlying said conductive pattern, said first dielectric layer comprising a first material and a second dielectric layer overlying said first dielectric layer, said second dielectric layer comprising a second material such that said antifuse material formed thereby will have an asymmetric current conduction characteristic.

4. The antifuse of claim 3 wherein one of said first and second materials is an oxide and the other of said materials is a nitride.

5. The antifuse of claim 1 wherein said substrate is an insulator.

6. A sublithographic semiconductor antifuse, said antifuse comprising:

a) a substrate;

b) a horizontally sublithographic polysilicon conductive pattern overlying said substrate, said conductive pattern having substantially vertical sidewalls;

c) a sidewall oxide about a perimeter of said conductive pattern;

d) a nitride-oxide asymmetric antifuse material overlying said conductive pattern;

e) a polysilicon conductive layer over said antifuse material whereby an antifusing area is formed between said conductive pattern and said conductive layer.

7. The antifuse of claim 6 wherein a voltage is applied across said conductive pattern and said conductive layer to breakdown said antifuse material and render said antifuse material conductive therebetween.

8. The antifuse of claim 7 wherein a first voltage of a first polarity must be applied across the antifuse to breakdown said antifuse and wherein a second voltage of the opposite polarity from said first polarity must be applied across the antifuse to breakdown said antifuse, said second voltage being substantially different from said first voltage.

9. The antifuse of claim 7 wherein conductive pattern is a silicided polysilicon material.

10. The antifuse of claim 7 wherein said substrate is a crystalline semiconductor.

* * * * *